US012299328B2

(12) United States Patent
Pereira et al.

(10) Patent No.: US 12,299,328 B2
(45) Date of Patent: May 13, 2025

(54) METHOD AND APPARATUS FOR CONFIGURING A NON-VOLATILE MEMORY DEVICE WITHOUT DATA TRANSFER

(71) Applicant: SAMSUNG ELECTRONICS CO., LTD., Suwon-si (KR)

(72) Inventors: Rowen Alphonso Pereira, Bengaluru (IN); Saugata Das Purkayastha, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/878,639

(22) Filed: Aug. 1, 2022

(65) Prior Publication Data
US 2023/0037665 A1 Feb. 9, 2023

(30) Foreign Application Priority Data

Aug. 4, 2021 (IN) .............................. 202141035163

(51) Int. Cl.
G06F 12/00 (2006.01)
G06F 3/06 (2006.01)

(52) U.S. Cl.
CPC .......... G06F 3/0659 (2013.01); G06F 3/0604 (2013.01); G06F 3/064 (2013.01); G06F 3/0656 (2013.01); *G06F 3/0679* (2013.01)

(58) Field of Classification Search
CPC ....... G06F 3/0604; G06F 3/064; G06F 3/0659
USPC ....................................................... 711/154
See application file for complete search history.

(56) References Cited

U.S. PATENT DOCUMENTS

| 8,902,647 | B1 * | 12/2014 | Raghu | ................. | G11C 16/22 |
| | | | | | 365/185.11 |
| 10,275,170 | B2 | 4/2019 | Ravimohan et al. | | |
| 2005/0228962 | A1 * | 10/2005 | Takase | ................. | G11C 16/06 |
| | | | | | 711/E12.008 |
| 2010/0257308 | A1 * | 10/2010 | Hsu | .................... | G06F 12/0246 |
| | | | | | 711/E12.019 |
| 2013/0107639 | A1 * | 5/2013 | Kim | .................... | G11C 7/02 |
| | | | | | 365/189.011 |
| 2016/0283110 | A1 * | 9/2016 | Jain | .................... | G06F 13/1668 |

(Continued)

FOREIGN PATENT DOCUMENTS

JP 2018-73040 A 5/2018

OTHER PUBLICATIONS

Communication issued Mar. 17, 2023 by the Intellectual Property Office of India in Indian Patent Application No. 202141035163.

*Primary Examiner* — Mohamed M Gebril
(74) *Attorney, Agent, or Firm* — Sughrue Mion, PLLC

(57) ABSTRACT

A method of operating a non-volatile memory device is provided. The device includes a latch, a page buffer and blocks, each of which includes pages. The method includes: receiving a page command for a write operation corresponding to a page of one of the blocks; receiving a write command for writing data to the page buffer; latching preexisting latched data or random data generated as latched data; writing the latched data to a page of a new block from among the plurality of blocks that corresponds to a page address based on the write command; and repeatedly updating the page address and repeatedly writing the latched data to additional pages corresponding to each updated page address until each page of the new block has been written to.

20 Claims, 6 Drawing Sheets

(56) References Cited

U.S. PATENT DOCUMENTS

| | | | |
|---|---|---|---|
| 2017/0116070 A1* | 4/2017 | Alrod | G11C 16/26 |
| 2017/0133087 A1* | 5/2017 | Park | G11C 16/10 |
| 2017/0322843 A1* | 11/2017 | Hsu | G06F 3/0688 |
| 2018/0075917 A1* | 3/2018 | Utsunomiya | G11C 16/3459 |
| 2018/0150400 A1* | 5/2018 | Agarwal | G11C 11/5628 |
| 2019/0198113 A1* | 6/2019 | Ben-Rubi | G11C 16/3459 |
| 2022/0122667 A1* | 4/2022 | Lee | G11C 11/5628 |
| 2023/0037665 A1* | 2/2023 | Pereira | G06F 3/0604 |

* cited by examiner

METHOD AND APPARATUS FOR CONFIGURING A NON-VOLATILE MEMORY DEVICE WITHOUT DATA TRANSFER

CROSS-REFERENCE TO THE RELATED APPLICATION

This application claims priority from Indian Patent Application No. 202141035163, filed on Aug. 4, 2021 in the Office of the Controller General of Patents, Designs and Trade Marks (Indian Patent Office), the disclosure of which is incorporated herein by reference in its entirety.

BACKGROUND

1. Field

Methods, apparatuses and systems consistent with example embodiments relate to a non-volatile memory device and in-particular to NAND memory chips in a solid-state storage device (SSD).

2. Related Art

Computer memory refers to a data storage device used to store information for use in a computer system or computer hardware. Solid-state drives (SSD) and hard disk drives (HDD) are examples of storage devices where information may be written to and read from the storage device.

NAND memory chips are an integral part of the SSD devices. Recently NAND Flash is increasingly popular due to its higher density and lower cost for high-performance applications. For example, NAND Flash has been implemented in SSDs, mobile phones, Flash memory cards, USB Flash drives and MP3/portable media player (PMP) players.

A NAND Flash array is grouped into a series of blocks. A block is the smallest erasable entity in a NAND Flash device. For example, for a NAND Flash block, erasing a block sets all bits of the block to 1 (and all bytes to FFh). Programming (i.e., writing data) is necessary to change erased bits from 1 to 0. Further, there is a limit to the number of times NAND Flash blocks can reliably be programmed and erased. For example, each NAND block may survive 100,000 PROGRAM/ERASE cycles. Further, many times there is a requirement to dummy program, or write dummy data to fill the block, or fill the block with same/unchanged data (i.e., refresh the stored data). For example, the block may be filled with data to implement NAND reliability features like Erase to Program Interval, Write same and the like. For every write request to NAND (for example, using 80h-10h command set) it is mandatory to transfer write data to from a host device to NAND. This transfer of write data increases the communication between a host device and a NAND device, thereby degrading performance and efficiency.

As mobility and energy efficiency are increasingly critical in electronic devices, there is a need for a method of programming a NAND device with dummy data without transferring data from the host to the NAND device for every word line.

SUMMARY

One or more example embodiments increase mobility and energy efficacy by programming a NAND device with dummy data without transferring data from the host to the NAND device for every word line.

According to an example embodiment, a method of operating a non-volatile memory device is provided. The non-volatile memory device includes a latch, a page buffer and a plurality of blocks, each of which includes a plurality of pages. The method includes: receiving a page command for a write operation corresponding to at least one page of one of the plurality of blocks; receiving a write command for writing data to the page buffer; latching any one or any combination of preexisting latched data and random data generated by the non-volatile memory device as latched data; writing the latched data to a page of a new block from among the plurality of blocks that corresponds to a page address based on the write command; and repeatedly updating the page address and repeatedly writing the latched data to additional pages of the new block corresponding to each updated page address until each page of the new block has been written to.

According to an example embodiment, a non-volatile memory device includes: a latch; a page buffer; a plurality of blocks, each of which includes a plurality of pages; and at least one processor configured to: receive a page command for a write operation corresponding to at least one page of one of the plurality of blocks; receive a write command for writing data to the page buffer; latch any one or any combination of preexisting latched data and random data generated by the at least one processor as latched data; write the latched data to a page of a new block from among the plurality of blocks that corresponds to a page address based on the write command; and repeatedly update the page address and repeatedly write the latched data to additional pages of the new block corresponding to each updated page address until each page of the new block has been written to.

According to an example embodiment, a non-volatile memory device includes: at least one controller; a latch device operatively coupled with the at least one controller and a page buffer; and an array of memory cells, wherein the memory cells are grouped into a plurality of pages and the plurality of pages are grouped into a plurality of blocks. The at least one controller is configured to: receive a page command for a write operation corresponding to at least one page of the plurality of blocks; receive a write command for writing data to the page buffer; latch any one or any combination of preexisting latched data and random data generated by the at least one controller as latched data; write the latched data to a page of a new block from among the plurality of blocks that corresponds to a page address based on the write command; and repeatedly update the page address and repeatedly write the latched data to additional pages of the new block corresponding to each updated page address until each page of the new block has been written to.

BRIEF DESCRIPTION OF FIGURES

The above and other aspects, features and advantages will become more apparent from the following description of example embodiments with reference to the accompanying drawings in which.

DETAILED DESCRIPTION

Example embodiments will be described more fully hereinafter with reference to the accompanying drawings, in which some example embodiments are shown. The drawings are not necessarily drawn to scale, and like numerals refer to like elements throughout. Repeated descriptions may be omitted. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Reference throughout this specification to "an aspect", "another aspect" or similar language indicates that a particular feature, structure, or characteristic described in connection with the example embodiment is included in at least one example embodiment of the present invention. Therefore, appearances of the phrase "in an example embodiment", "in another example embodiment" and similar language throughout this specification may, but do not necessarily, all refer to the same example embodiment.

The terms "comprises", "comprising", or any other variations thereof, describe a non-exclusive inclusion, such that a process or method that comprises a list of operations may include other operation not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Unless otherwise defined, all technical and scientific terms used herein have meanings commonly understood by one of ordinary skill in the art to which this disclosure belongs. The system, methods, and examples provided herein are illustrative only and are not intended to be limiting.

Figure 1:
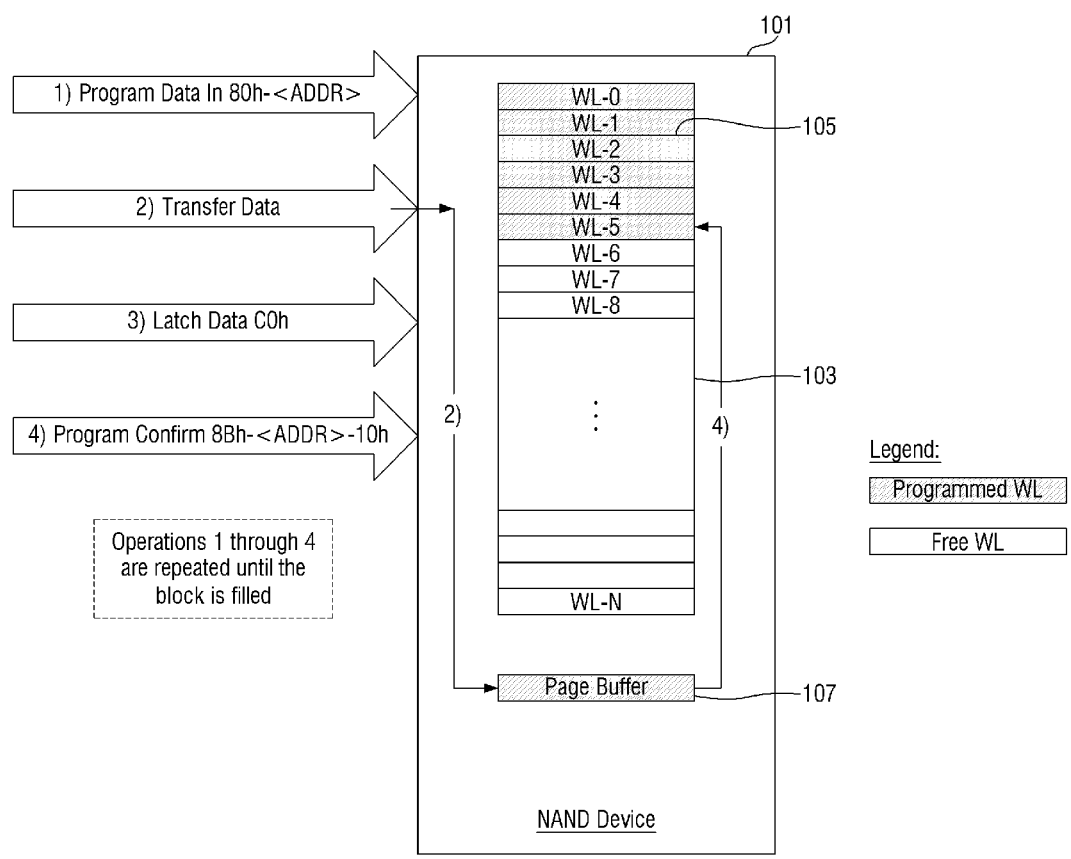
FIG. 1 illustrates an operation of the NAND device.

FIG. 1 illustrates operation of a NAND device. The NAND device 101 includes a memory array, which is separated into several blocks. Although FIG. 1 only illustrates one block 103, the NAND device 101 includes a plurality of blocks. The block 103 is the smallest erasable unit of storage in the NAND device 101. Each of the blocks may include a plurality of pages. A page is the smallest programmable unit of storage in the NAND device 101. A page may indicate cells linked with the same word line (WL). Each of the pages may include a plurality of memory cells. In the memory array, a data erase operation may be performed in units of blocks, and a data write operation and a data read operation may be performed in units of pages.

In operation 1, a program command, such as 80h, may be provided to control the NAND device 101 to operate in the programmable state. As shown, the program command includes an address indicating which page or pages are to be programmed (or written to). The program command such as 80h-10h command set may be a sequence of opcodes like 80h, followed by address of the NAND page, then the data bytes, C0h. With C0h, the data is placed in the NAND internal buffer (also known as latch). Next 8Bh, followed by the address of NAND page and 10h write the data from NAND internal buffer to the NAND cells. At operation 2, dummy data which is to be filled in one or more blocks of the NAND device is received from a host and transferred to the NAND device 101. At operation 3, the data is latched into the page buffer 107. At operation 4, a program confirm command is issued that programs the data latched in the page buffer 107 to the one or more NAND cells based on an address of the block or page provided in the program confirm command. Thus, according to the FIG. 1 it can be seen that the first six word lines (WL-0, WL-1 . . . , WL-5) may be filled by data which is being transferred by a host. Then, each of the four operations 1-4 is repeated for subsequent word lines WL-6 to WL-N until the block or page is full. In this regard, data must be repeatedly transferred from the host to the NAND device 101 for the subsequent word lines WL-6 to WL-N to be programmed with the dummy data.

Example embodiments relate to a method and system including a non-volatile memory device, in particular, to a NAND device. According to the present disclosure, the NAND device may accept a write command with write data, and may also accept a write command without write data. Data to be written to the NAND device based on a write command without write data can be provided as dummy data in different ways. For example, a last available data on an internal page cache where the data is held before writing to NAND cells of the NAND device 101 may be being utilized as the dummy data to fill the NAND device for dummy programming. As another example, random data can be generated internally on the page cache by the NAND device 101, and the randomly generated data may be being utilized as the dummy data to fill the NAND device for dummy programming. Thus, data does not need to be repeatedly transferred from the host to the NAND device 101 as the dummy data is written to fill the block of the NAND device 101. For example, as discussed below in more detail, repeated data transfer may be eliminated when (i) data is expected to be same or (ii) any arbitrary data is to be stored throughout a programmable unit.

Figure 2:
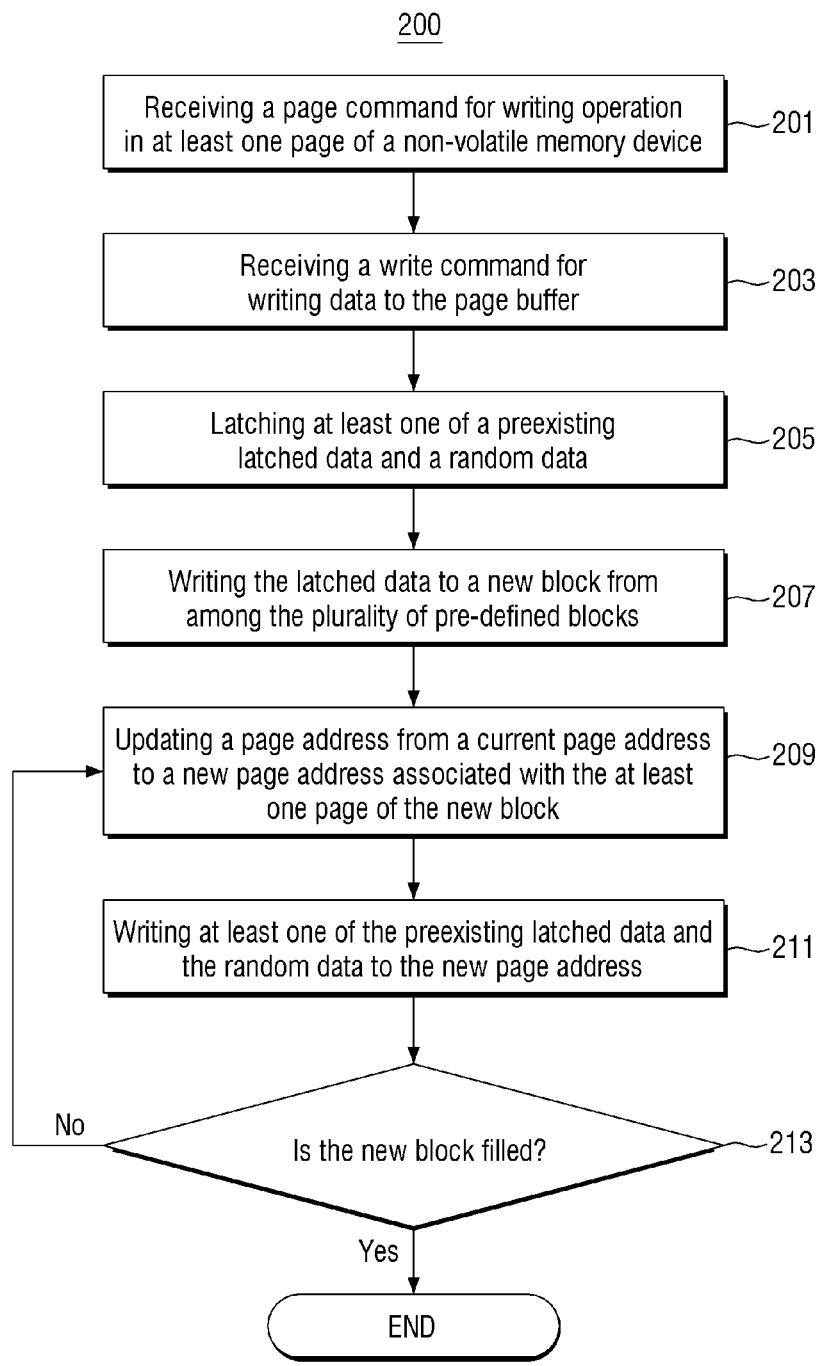
FIG. 2 illustrates a flow chart for configuring a non-volatile memory device, according to an example embodiment.

FIG. 2 illustrates a flow chart of operating a non-volatile memory device, according to an example embodiment. The method 200 may be implemented using various non-volatile memory devices. For example, the non-volatile memory device may be a NAND device. However, example embodiments are not limited thereto and the non-volatile memory device may be another non-volatile memory device.

The method 200 includes receiving a page command for a write operation in at least one page of a non-volatile memory device. The page may be one or a plurality of pre-defined blocks and may be an erasable unit of the non-volatile memory device. (operation 201). In operation 203, a write command for writing data to a page buffer is received. In operation 205, the method 200 includes latching at least one of preexisting latched data and random data. In operation 207, the method includes writing the latched data to a new block from among the plurality of pre-defined blocks based on the write command. Thereafter, in operation 209, a page address is updated from a current page address to a new page address associated with the at least one page of the new block. In operation 211 the method includes writing, data to the new page address. In operation, it is identified whether the new block is filled. If the new block is filled, then the process ends. If the new block is not filled, then the process returns to operation 209 and the page address is updated again.

In an example embodiment, the method 200 includes configuring the at least one page in the new block with the preexisting latched data. The configuring the at least one page includes fetching the preexisting latched data from the page buffer and writing the preexisting data to the at least one page in the new block. In an example embodiment, the preexisting latched data may be data that was previously transferred to the page buffer through the page command. For example, the preexisting latched data may be data that was previously written to another block. As an example, the preexisting latched data may include a last pre-programmed data that was latched on the page buffer. The method 200 further includes latching the fetched preexisting latched data on the updated page address of the at least one page and thereafter, repeatedly writing, onto the at least one page in the new block, the fetched preexisting latched data until the new block is filled.

In another implementation the method 200 includes configuring the at least one page in the new block with random data. The configuring the at least one page includes generating the random data for writing to the at least one page of the new block. Thereafter, the method 200 includes latching the randomly generated data, and writing the randomly generated data to the updated page address of the at least one page and repeatedly writing the randomly generated data to the new block until the new block is filled. For example, the randomly generated data may be generated for the different pages of the new block.

In yet another implementation, the method 200 includes generating random data to be written to a plurality of pages in the new block until the end of the new block in a single operation. Thereafter, the method 200 includes latching the randomly generated data, and writing the randomly generated data to a respective plurality of pages in the new block and writing the randomly generated data to each of the pages from the plurality of pages in the new block until the end of the new block. For example, the same randomly generated data may be written to multiple pages of the new block.

Figure 3:
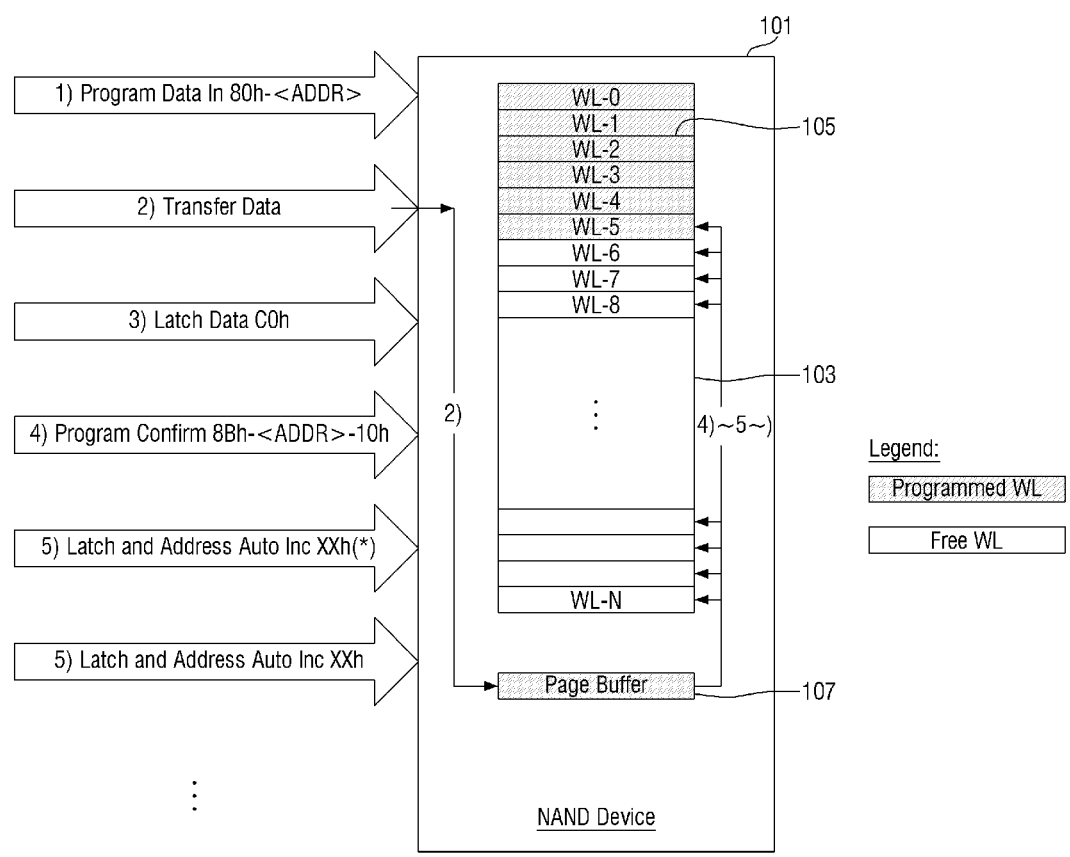
FIG. 3 illustrates a detailed operation flow for configuring a non-volatile memory device with a pre-existing latch data, according to an example embodiment.

FIG. 3 illustrates a detailed operation flow for configuring a non-volatile memory device with pre-existing latch data, according to an example embodiment. FIG. 3 will be explained while referring to FIG. 2. Further for the sake of brevity same reference numerals are used as applicable.

Initially at operation 1, a page command for a write operation or a data program operation in at least one page is received. For example, the page command for programming the data may be received from a host. For example, the page command may be an 80h opcode. The program command may be followed by a first world line (WL) address provided by the host. As an example, the first WL may be associated with a page address associated with a block where data is to be stored. This operation 1 corresponds to the operation 201 of the FIG. 2. Subsequently, a write command is received from the host for writing or transferring the data to a page buffer 107 of the NAND device 101. This operation 2 corresponds to the operation 203 of the FIG. 2. Thereafter, at operation 3 the data which has been transferred to the page buffer 107 is latched by a latch device of the NAND device 101. For example, a latch command for latching the data of the page buffer, may be performed by issuing a C0h opcode. Subsequently, at operation 4 a program confirm command is issued.

Figure 5:
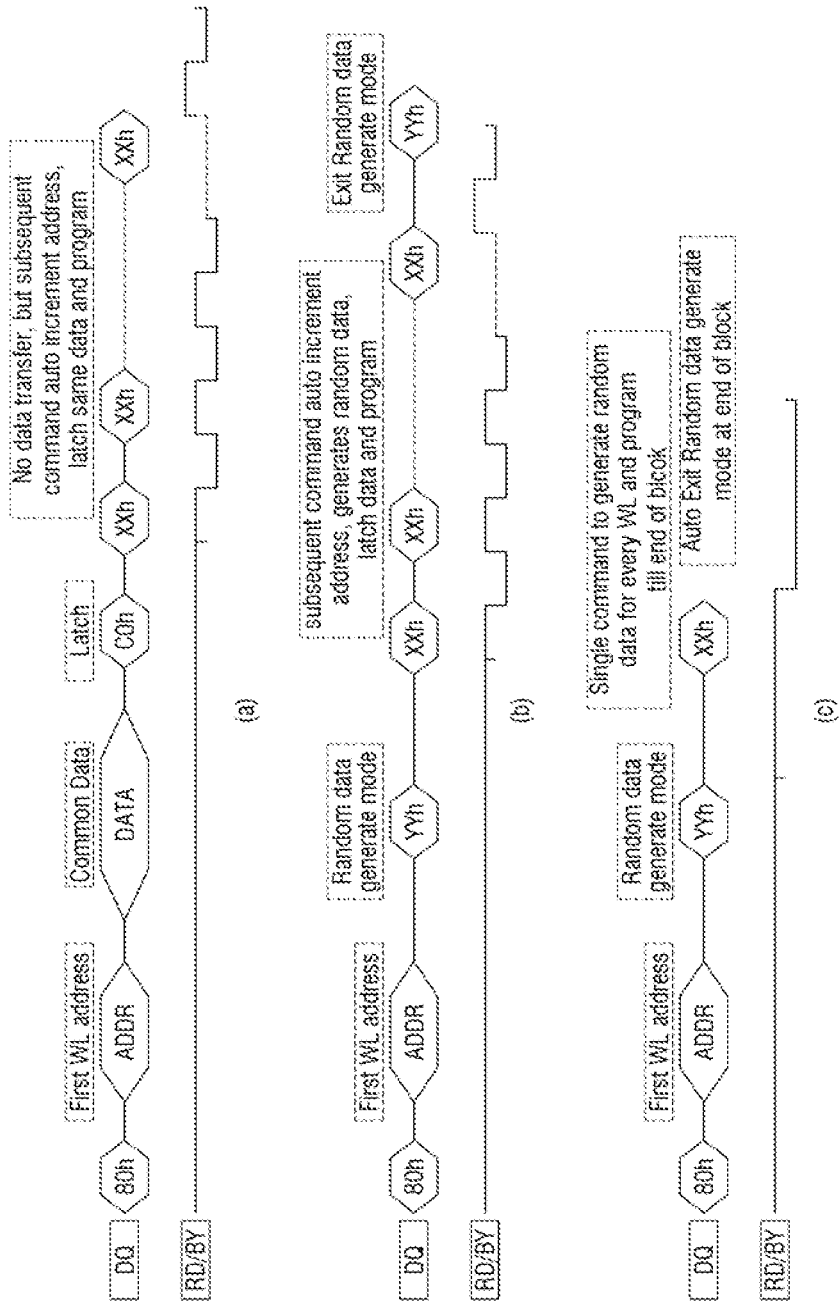
FIG. 5. illustrates timing diagram for the method in FIGS. 3 and 4, according to an example embodiment.

For example, the program confirm command may be an 8Bh opcode. Thereafter, at operation 5, a special command may be issued to control the data that has been latched in the latch device so that the same data which was previously latched in the latch buffer is programmed to pages of a new block. The special command may be followed by a page address identifying a page of the new block. The previously latched data may be repeatedly written to at least one additional page of the new block until the new block is filled. The special command may be a new command, for example, an XXh opcode. To write the same data to the additional pages of the new block, the NAND device 101 updates (i.e., automatically increments, which means continuously programming the subsequent pages) the page address from a current page address to a new page address, and programs the previously latched data that has been latched in the latch device to a page of the new block that is adjacent the page of the new block associated with the current page address. The NAND device 101 may latch the same data on the page buffer and program pages of the new block repeatedly until the new block is filled. Thus, the last available data on the internal page cache is utilized thereby eliminating the repetition of the operations 1 to 4 for programing each WL until the page or block was full. In case of XYh, NAND generates the random data and puts it in the NAND page buffer. Next, it will keep on programming the random data until the end of the block. This operation 5 corresponds to the operations 205-213 of the FIG. 2. The timing diagram for performing the operation of the FIG. 3 is shown in portion (a) of FIG. 5. For example, the data corresponding to the operation 1 may be written in a portion of the block, and the remaining portion of the block may be filled with the latched data. As another example, the data corresponding to the operation 1 may be written in a portion of one block, and another block may be filled with the latched data. As the latched data is already stored in the NAND device 101, there is no data transferred from the host to the NAND device 101 as the latched data is stored in the block and programmed as dummy data.

Figure 4:
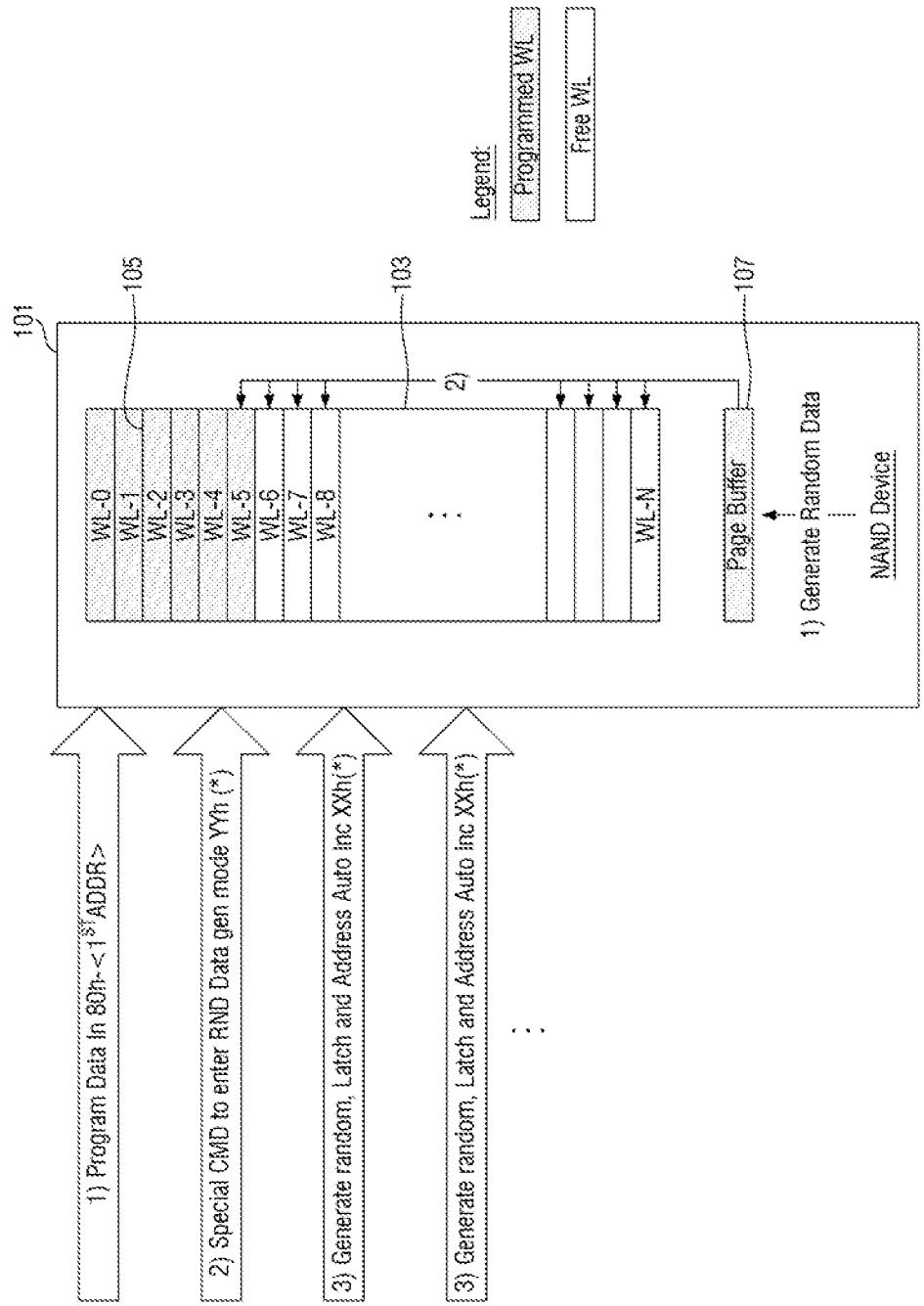
FIG. 4. illustrates a detailed operation flow for configuring a non-volatile memory device with a randomly generated data, according to an example embodiment.

FIG. 4 illustrates a detailed operation flow for configuring a non-volatile memory device with randomly generated data, according to an example embodiment of the present disclosure. FIG. 4 will be explained while referring to FIGS. 2 and 3. Further for the sake of brevity same reference numerals are used as applicable.

Initially at operation 1, a page command for a write operation or a data program operation in at least one page is received. For example, the page command for programming the data is received from a host. For example, the page command may be an 80h opcode. The program command may be followed by a first world line (WL) address provided by the host indicating a location in the block to start random fill. As an example, the first WL may be associated with a new page address associated with a new block where the new block is to be filled with the random data. Subsequently, at operation 2, the NAND device 101 may receive a special command which controls the NAND device 101 to enter a random data generation mode. As an example, the special command to enter the random data generation mode may be the opcode YYh. This operation 1 corresponds to the operations 201-203 of the FIG. 2. Thereafter, at operation 3 random data is generated for writing to the at least one page of the new block, and the generated random data is written to the at least one page. Operation 3 is repeated until data is written to all of the new block (i.e., the new block is filled). In this regard, the randomly generated data is generated and the page address is updated (i.e., automatically incremented) and the randomly generated data is programmed to the updated page address. The operation 3 is repeated until the block is full. The operations of latching, updating and automatically incrementing correspond to the operations 205-213 of the FIG. 2 and operation 5 of the FIG. 3. The timing diagram for performing the operation of the FIG. 4 is shown in portion (b) of FIG. 5. The random data may be a system generated data. This is useful when the NAND device is needed to dummy fill remainder of block without affecting the initial user data written at the start for example, in shutdown or deep sleep modes etc. For example, the data corresponding to the operation 1 may be written in a portion of the block, and the remaining portion of the block may be filled with randomly generated data. As another example, the data corresponding to the operation 1 may be written in a portion of one block, and another block may be filled with randomly generated data. As the randomly generated data is generated by the NAND device 101, there is no data transferred from the host to the NAND device 101 as the randomly generated data is generated by the NAND device 101 and programmed as dummy data.

According to an example embodiment, another opcode XYh may control the NAND device 101 to generate and program random data for every WL until the end of the block. In this regard, a single command XYh may be issued by the host to control the NAND device 101 to repeatedly generate random data for WL and program the randomly generated data until end of the block. In particular, the random data may be generated for a plurality of pages in the new block in a single operation. Thereafter, the random data may be latched and programmed to a respective plurality of pages in the new block until the end of the new block. For example, the same randomly generated data may be programmed to multiple pages of the new block. According to this example embodiment operations 1 and 2 as describe in the FIG. 4 remain substantially the same. The timing diagram for performing the operation for generating the random data that is programmed to multiple blocks is shown in portion (c) of FIG. 5.

Figure 6:
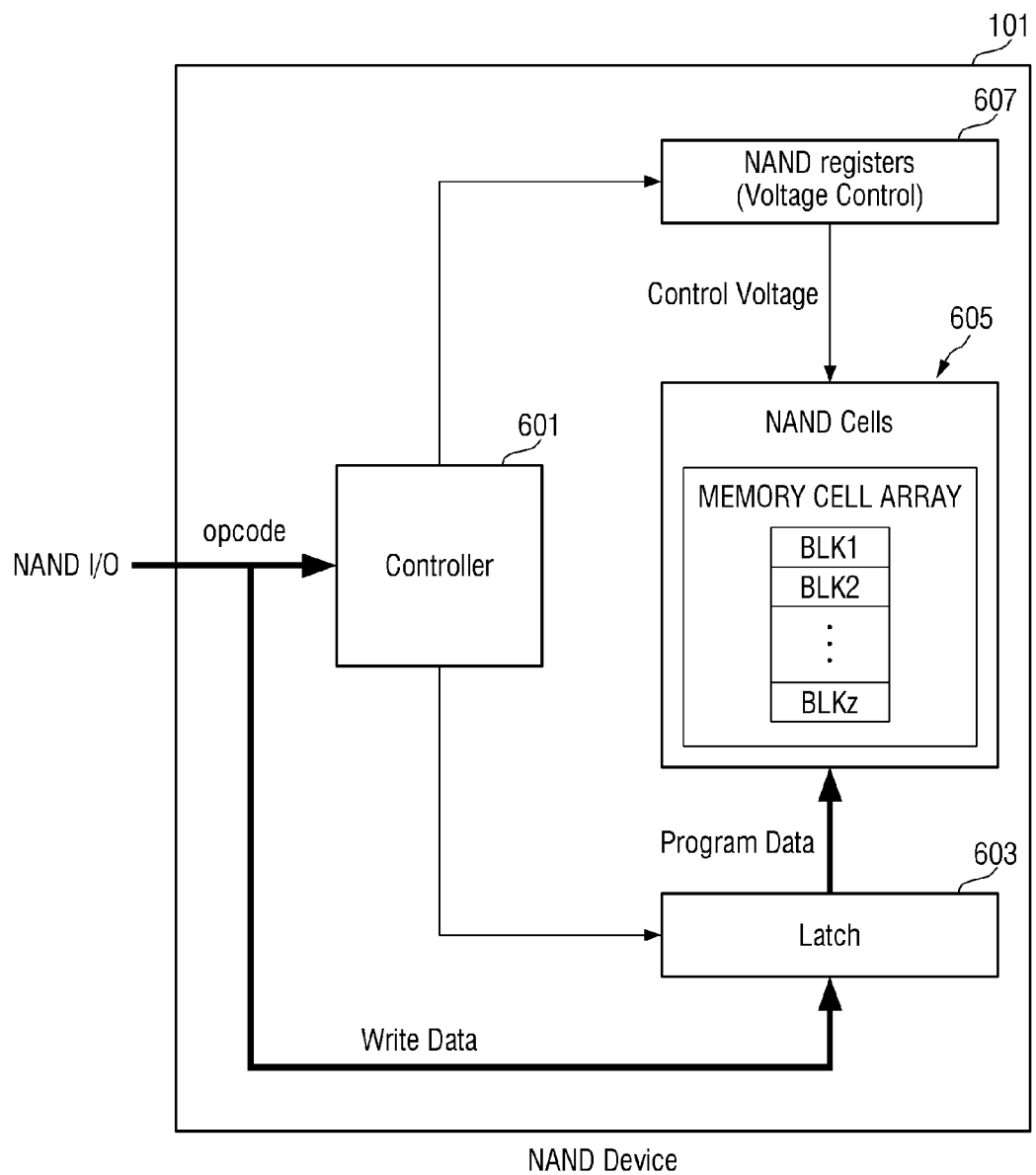
FIG. 6 illustrates a non-volatile memory device i.e. NAND device, according to an example embodiment.

FIG. 6 illustrates a non-volatile memory device i.e., NAND device 101, according to an example embodiment. The NAND device 101 includes a controller 601 which is operatively connected with a latch device 603, and one or more memory array cells (e.g., NAND cells 605) and a NAND register 607. The latch device 603 is also operatively coupled with page buffer, as shown in FIGS. 3 and 4. The controller 601 may be configured to implement one or more of the methods shown in FIGS. 2-4. Alternately, the methods implemented in the FIGS. 2-4 may be configured to be implemented by at least one processor.

One or more example embodiments provide the following technical advantages:

By executing commands such as write same, write zero, without data transfer, one or more example embodiments may improve the performance by more than 10% when compared to write commands.

One or more example embodiments provide an improvement in PCMark scores. Further, one or more example embodiments improve a response to flush command as data transfer is avoided for these dummy transfers.

One or more example embodiments provide an improvement in timings of shutdown, standby, and low power mode transitions as dummy data transfer is avoided while filling unused word lines of blocks.

One or more example embodiments provide faster response times of write commands issued in between dummy fill operations, as buffers are not allocated for data transfer to the NAND media.

One or more example embodiments provide bus timing diagrams which clearly indicate missing data phase for program operations during flush, shutdown, low power mode transitions etc., thus improving the efficiency of the NAND device programming.

Further, one or more example embodiments provide an improved processing speeds for many NAND reliability features which require filling entire blocks with random data so that blocks stay reliable on subsequent usage (erase and program). The entire block can be filled with issuing of just one command set. Further, blocks may be filled with a fixed pattern without data transfer for every word line.

As will be appreciated by one skilled in the art, aspects of the present disclosure may be embodied as a system, method or computer program product. Accordingly, aspects of the present disclosure may take the form of an entirely hardware example embodiment, an entirely software example embodiment (including firmware, resident software, micro-code, etc.) or an example embodiment in which software and hardware aspects are combined, and may all generally be referred to herein as a "circuit," "module" "device" or "system." Furthermore, aspects of the present disclosure may take the form of a computer program product embodied in one or more computer readable medium(s) having computer readable program code embodied thereon.

Many of the functional aspects described in this specification have been referred to as modules, in order to more particularly emphasize their implementation independence. For example, a module may be implemented as a hardware circuit including custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, include one or more physical or logical blocks of computer instructions, which may, for instance, be organized as an object, procedure, or function. The executables of an identified module need not be physically located together, but may include disparate instructions stored in different locations which, when joined logically together, form the module and achieve the stated purpose for the module.

A module of computer readable program code may be a single instruction, or many instructions, and may be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, as electronic signals on a system or network. Where a module or portions of a module are implemented in software, the computer readable program code may be stored and/or propagated on or in one or more computer readable medium (s).

The computer readable medium may be a tangible or non-transitory computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium include, but are not limited to, a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing. In one example embodiment, the computer readable medium may include a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

While specific language has been used to describe example embodiments, any limitations arising on account of the same are not intended. As would be apparent to a person in the art, various working modifications may be made to the method to implement the inventive concept as taught herein.

The drawings and the forgoing description give examples of embodiments. Those skilled in the art will appreciate that one or more of the described elements may well be combined into a single functional element. Alternatively, certain elements may be split into multiple functional elements. Elements from one example embodiment may be added to another example embodiment. For example, orders of processes described herein may be changed and are not limited to the manner described herein.

Moreover, the actions of any flow diagram need not be implemented in the order shown nor do all of the acts necessarily need to be performed. Also, those acts that are not dependent on other acts may be performed in parallel with the other acts. The scope of example embodiments is by no means limited by these specific examples. Numerous variations, whether explicitly given in the specification or not, such as differences in structure, dimension, and use of material, are possible. The scope of example embodiments is at least as broad as given by the following claims.

Benefits, other advantages, and solutions to problems have been described above with regard to specific example embodiments. However, the benefits, advantages, solutions to problems, and any component(s) that may cause any benefit, advantage, or solution to occur or become more pronounced are not to be construed as a critical, required, or essential feature or component of any or all the claims.

While example embodiments have been shown and described above, it will be apparent to those skilled in the art that modifications and variations could be made without departing from the scope of the present inventive concept as defined by the appended claims.

What is claimed is:

1. A method of operating a non-volatile memory device that includes a latch, a page buffer and a plurality of blocks, each of which includes a plurality of pages, the method comprising:
   receiving a page command for a write operation corresponding to at least one page of one of the plurality of blocks;
   receiving a write command for writing data to the page buffer;
   latching any one or any combination of preexisting latched data and random data generated by the non-volatile memory device as latched data;
   writing the latched data to a page of a new block from among the plurality of blocks that corresponds to a page address based on the write command; and
   repeatedly updating the page address and repeatedly writing the latched data to additional pages of the new block corresponding to each updated page address until each page of the new block has been written to.

2. The method as claimed in claim 1, further comprising:
   fetching the preexisting latched data from the page buffer, wherein the preexisting latched data was transferred to the page buffer through the page command, wherein the preexisting latched data corresponds to a last preprogrammed data that was previously latched to the page buffer; and
   latching the fetched preexisting latched data as the latched data,
   wherein the fetched preexisting latched data is commonly stored in each of the additional pages of the new block.

3. The method as claimed in claim 1, further comprising:
   generating the random data; and
   latching the generated random data as the latched data,
   wherein the generated random data is commonly stored in each of the additional pages of the new block.

4. The method as claimed in claim 3, further comprising:
   generating the random data for multiple pages of the new block in a single operation.

5. The method as claimed in claim 1, further comprising:
receiving a data write command and data corresponding to the data write command;
storing the data corresponding to the data write command to a page of another block of the plurality of blocks; and
latching the data corresponding to the data write command as the latched data,
wherein the data corresponding to the data write command is commonly stored in each of the additional pages of the new block.

6. The method as claimed in claim 1, further comprising identifying whether to latch the preexisting latched data or the random data as the latched data based on the write command.

7. The method as claimed in claim 1, wherein the write command indicates the page of the new block.

8. A non-volatile memory device comprising:
a latch;
a page buffer;
a plurality of blocks, each of which comprises a plurality of pages; and
at least one processor configured to:
receive a page command for a write operation corresponding to at least one page of one of the plurality of blocks;
receive a write command for writing data to the page buffer;
latch any one or any combination of preexisting latched data and random data generated by the at least one processor as latched data;
write the latched data to a page of a new block from among the plurality of blocks that corresponds to a page address based on the write command; and
repeatedly update the page address and repeatedly write the latched data to additional pages of the new block corresponding to each updated page address until each page of the new block has been written to.

9. The non-volatile memory device as claimed in claim 8, wherein the at least one processor is further configured to:
fetch the preexisting latched data from the page buffer, wherein the preexisting latched data was transferred to the page buffer through the page command, wherein the preexisting latched data corresponds to a last preprogrammed data that was previously latched to the page buffer; and
latch the fetched preexisting latched data as the latched data, and
wherein the fetched preexisting latched data is commonly stored in each of the additional pages of the new block.

10. The non-volatile memory device as claimed in claim 8, wherein the at least one processor is further configured to:
generate the random data; and
latch the generated random data as the latched data
wherein the generated random data is commonly stored in each of the additional pages of the new block.

11. The non-volatile memory device as claimed in claim 10, wherein the at least one processor further configured to:
generate the random data for multiple pages of the new block in a single operation.

12. The non-volatile memory device as claimed in claim 8, wherein the at least one processor is further configured to:
receive a data write command and data corresponding to the data write command;
store the data corresponding to the data write command to a page of another block of the plurality of blocks; and
latch the data corresponding to the data write command as the latched data
wherein the data corresponding to the data write command is commonly stored in each of the additional pages of the new block.

13. The non-volatile memory device as claimed in claim 8, wherein the at least one processor is further configured to identify whether to latch the preexisting latched data or the random data as the latched data based on the write command.

14. The non-volatile memory device as claimed in claim 8, wherein the write command indicates the page of the new block.

15. A non-volatile memory device comprising:
at least one controller;
a latch device operatively coupled with the at least one controller and a page buffer; and
an array of memory cells, wherein the memory cells are grouped into a plurality of pages and the plurality of pages are grouped into a plurality of blocks,
wherein the at least one controller is configured to:
receive a page command for a write operation corresponding to at least one page of the plurality of blocks;
receive a write command for writing data to the page buffer;
latch any one or any combination of preexisting latched data and random data generated by the at least one controller as latched data;
write the latched data to a page of a new block from among the plurality of blocks that corresponds to a page address based on the write command; and
repeatedly update the page address and repeatedly write the latched data to additional pages of the new block corresponding to each updated page address until each page of the new block has been written to.

16. The non-volatile memory device as claimed in claim 15, wherein the at least one controller is further configured to:
fetch the preexisting latched data from the page buffer, wherein the preexisting latched data was transferred to the page buffer through the page command, wherein the preexisting latched data corresponds to a last preprogrammed data that was previously latched to the page buffer; and
latch the fetched preexisting latched data as the latched data,
wherein the fetched preexisting latched data is commonly stored in each of the additional pages of the new block.

17. The non-volatile memory device as claimed in claim 16, wherein the at least one controller is further configured to:
generate the random data; and
latch the generated random data as the latched data
wherein the generated random data is commonly stored in each of the additional pages of the new block.

18. The non-volatile memory device as claimed in claim 17, wherein the at least one controller is further configured to:
generate the random data for multiple pages of the new block in a single operation.

19. The non-volatile memory device as claimed in claim 15, wherein the at least one controller is further configured to:
receive a data write command and data corresponding to the data write command;
store the data corresponding to the data write command to a page of another block of the plurality of blocks; and latch the data corresponding to the data write command as the latched data, and wherein the data corresponding to the data write command is commonly stored in each of the additional pages of the new block.

20. The non-volatile memory device as claimed in claim 15, wherein the at least one controller is further configured to identify whether to latch the preexisting latched data or the random data as the latched data based on the write command.

\* \* \* \* \*